(12) United States Patent
Lee et al.

(10) Patent No.: US 7,393,410 B2
(45) Date of Patent: Jul. 1, 2008

(54) METHOD OF MANUFACTURING NANO-WIRE

(75) Inventors: Sang-Hyun Lee, Yongin-si (KR); Tae-Won Jeong, Seoul (KR); Jeong-Na Huh, Yongin-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 241 days.

(21) Appl. No.: 11/114,196

(22) Filed: Apr. 26, 2005

(65) Prior Publication Data
US 2005/0235904 A1    Oct. 27, 2005

(30) Foreign Application Priority Data
Apr. 27, 2004    (KR) .................. 10-2004-0029193

(51) Int. Cl.
*C30B 25/00* (2006.01)
*C30B 29/66* (2006.01)

(52) U.S. Cl. .............. 117/84; 117/87; 117/88; 117/106; 117/920; 977/813; 977/814; 977/825

(58) Field of Classification Search ............ 117/84, 117/87, 88, 106, 920; 977/813–825
See application file for complete search history.

(56) References Cited

U.S. PATENT DOCUMENTS

| | | | |
|---|---|---|---|
| 5,352,512 A * | 10/1994 | Hoffman | 428/311.51 |
| 6,221,154 B1 * | 4/2001 | Lee et al. | 117/87 |
| 6,413,880 B1 * | 7/2002 | Baski et al. | 438/759 |
| 6,656,573 B2 * | 12/2003 | Chen et al. | 117/105 |
| 6,962,823 B2 * | 11/2005 | Empedocles et al. | 438/3 |
| 2004/0175844 A1 * | 9/2004 | Yang et al. | 438/2 |
| 2004/0262636 A1 * | 12/2004 | Yang et al. | 257/200 |
| 2005/0009224 A1 * | 1/2005 | Yang et al. | 438/57 |
| 2005/0211154 A1 * | 9/2005 | Alivisatos et al. | 117/1 |
| 2006/0138575 A1 * | 6/2006 | Kamins | 257/419 |
| 2006/0240591 A1 * | 10/2006 | Grier et al. | 438/99 |
| 2006/0257985 A1 * | 11/2006 | Lovley et al. | 435/168 |

OTHER PUBLICATIONS

Vayssieres et. al., Three Dimensional Array of Highly Oriented Crystalline ZnO Microtubes, Dec. 2001, American Chemical Society, vol. 13 No. 12, pp. 4395-4398.*

(Continued)

*Primary Examiner*—Robert Kunemund
*Assistant Examiner*—G. Nagesh Rao
(74) *Attorney, Agent, or Firm*—Robert E. Bushnell, Esq.

(57) ABSTRACT

There is provided a method of manufacturing a nano-wire using a crystal structure. In the method of manufacturing a nano-wire, a crystal grain having a plurality of crystal faces is used as a seed, and a crystal growing material having a lattice constant difference within a predetermined range is deposited on the crystal grain, thereby allowing the nano-wire to grow from at least one of the crystal faces. Therefore, it is possible to give the positional selectivity with a simple process using a principle of crystal growth and to generate a nano-structure such as a nano-wire, etc. having good crystallinity. Further, it is possible to generate a different-kind junction structure having various shapes by adjusting a feature of a crystal used as a seed.

16 Claims, 6 Drawing Sheets

OTHER PUBLICATIONS

Yin et. al., Fabrication of Highly Ordered Metallic Nanowire Arrays by Electrodeposition, Aug. 2001, American Inst. of Physics, vol. 79 No. 7, pp. 1039-1041.*

Vayssieres et. al., Growth of Arrayed Nanorods and Nanowires of ZnO from Aqueos Solutions, Mar. 2003, Journal of Advanced Materials, vol. 15 No. 5, pp. 464-466.*

Zhang et. al., Metal-catalyst-free Epitaxial Growth of Aligned ZnO Nanowires on Silicon Wafers at Low Temperature, Jan. 2004, Inst. of Physics, vol. 37, pp. 413-415.*

Alfredo M. Morales, et al., "A Laser Ablation Method for the Synthesis of Crystalline Semiconductor Nanowires"; Science vol. 279 p. 208 (1998).

Zheng Wei Pan, et al., "Nanobelts of Semiconducting Oxides"; Science vol. 291 p. 1948 (2001).

* cited by examiner

METHOD OF MANUFACTURING NANO-WIRE

CLAIM OF PRIORITY

This application claims the priority of Korean Patent Application No. 10-2004-0029193, filed on Apr. 27, 2004, in the Korean Intellectual Property Office, the disclosure of which is incorporated herein in its entirety by reference.

BACKGROUND OF THE INVENTION

1. Field of the Invention

The present invention relates to a method of manufacturing a nano-wire, and more particularly, to a method of manufacturing a nano-wire used in an electronic element.

2. Description of the Related Art

Recently, many researches for a semiconductor nano-structure have been progressed, and researches for applying the semiconductor nano-structure to various fields of electric elements, photoelectric elements, gas sensors, etc. by using a unique feature according to shapes and sizes have been progressed.

In a conventional representative synthesizing method, a material is synthesized using a metal catalyst and using a laser ablation, a thermal deposition, etc. (Alfredo M. Morales et al., "A Laser Ablation Method for the Synthesis of Crystalline Semiconductor Nanowires" SCIENCE VOL. 279 208 (1998); and Zheng Wei Pan et al., "Nanobelts of Semiconducting Oxides" SCIENCE VOL. 291 1948 (2001)).

In the method suggested by Morales et al., metal used as a seed in a substrate or powder shape could operate as interior impurities, using a resolution of a surface of a metal catalyst and a simple two-dimension structure could be obtained. Further, the material which can be synthesized by a catalyst metal is limited.

SUMMARY OF THE INVENTION

It is therefore an object of the present invention to provide a method of manufacturing a nanostructure.

It is further an object of the present invention to provide a method of manufacturing a nano-wire having excellent crystallinity, high purity, and wide application fields.

According to an aspect of the present invention, there is provided a method of manufacturing a nano-wire includes: preparing a crystal grain having a plurality of crystal faces as a seed; and depositing a crystal growing material on the crystal grain to grow the nano-wire from at least one of the crystal faces, a lattice constant difference between the crystal grain and the crystal growing material being within a predetermined range.

According to an aspect of the present invention, a method of manufacturing a nanostructure includes: preparing a crystal grain having a plurality of crystal faces as a seed on a substrate; and depositing a crystal growing material on the crystal grain to grow the crystal growing material from at least one of the crystal faces, a lattice constant difference between the crystal grain and the crystal growing material being not more than 5%.

The same or different kind of material may be used as the crystal grain and the crystal growing material, and the deposition may be performed using a chemical vapor deposition method or a vacuum deposition method.

When an oxide of the crystal growing material is required during depositing, the oxide on the surface of the crystal grain may be grown by supplying a predetermined amount of oxygen or air including the oxygen in deposition space.

According to embodiments of the present invention, the crystal grain may be a crushed crystal grain or a crystal grain grown from a substrate.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein:.

DETAILED DESCRIPTION OF THE PREFERRED EMBODIMENTS

Now, the present invention will be described in more detail with reference to the attached drawings.

The present invention basically uses a seed having a steric structure.

The seed having a steric structure has a predetermined crystal structure, and a wire to be grown is grown from a crystal face of the seed, and one or more wires can be grown from several crystal faces of the seed according to conditions.

First, a crystal grain is prepared as a seed on a substrate. The crystal grain has a plurality of crystal faces and is directly grown from the substrate or is attached as a crushed crystal grain.

The crystal grain directly grown from the substrate is grown into an island shape on the substrate, for example, a silicon substrate by a chemical vapor deposition method, etc. A known method can be applied in growing a crystal of an island shape. Preferably, the chemical vapor deposition method among the known method can be applied in growing the crystal of an island shape.

The crystal grain prepared with crushed particles is sprayed with an extremely small quantity on the substrate at a dispersed state in an organic solvent such as an acetone, and the organic solvent is removed by a natural dry or a compulsive dry after spraying. The crushed crystal grains have a very small grain size and are adsorbed on the substrate by a molecular force, etc. even after removing the organic solvent.

Growth of the same or different kind of material on the crystal grains, that is, growth of a nano-wire on crystal faces of the crystal grains is preformed by a chemical vapor deposition method or a vacuum heat deposition method.

Figure 1A:
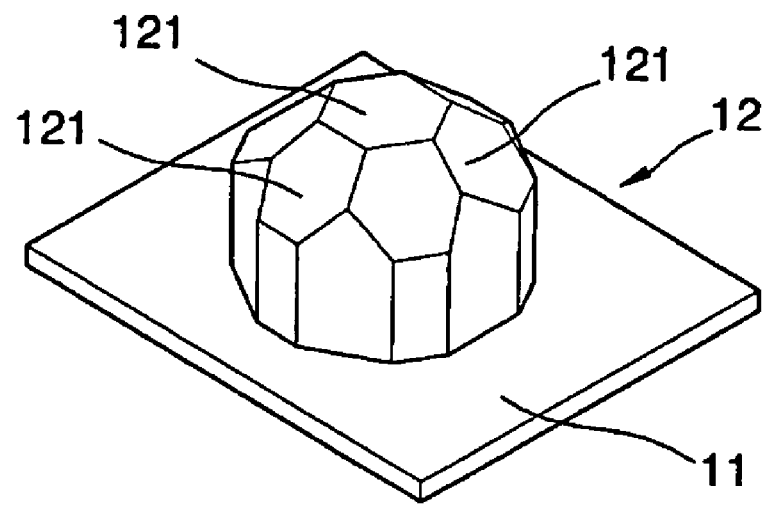
FIGS. 1A and 1B are diagrams symbolically illustrating a structure of a crystal grain as a seed grown into an island shape on a substrate according to the present invention.
Figure 1B:
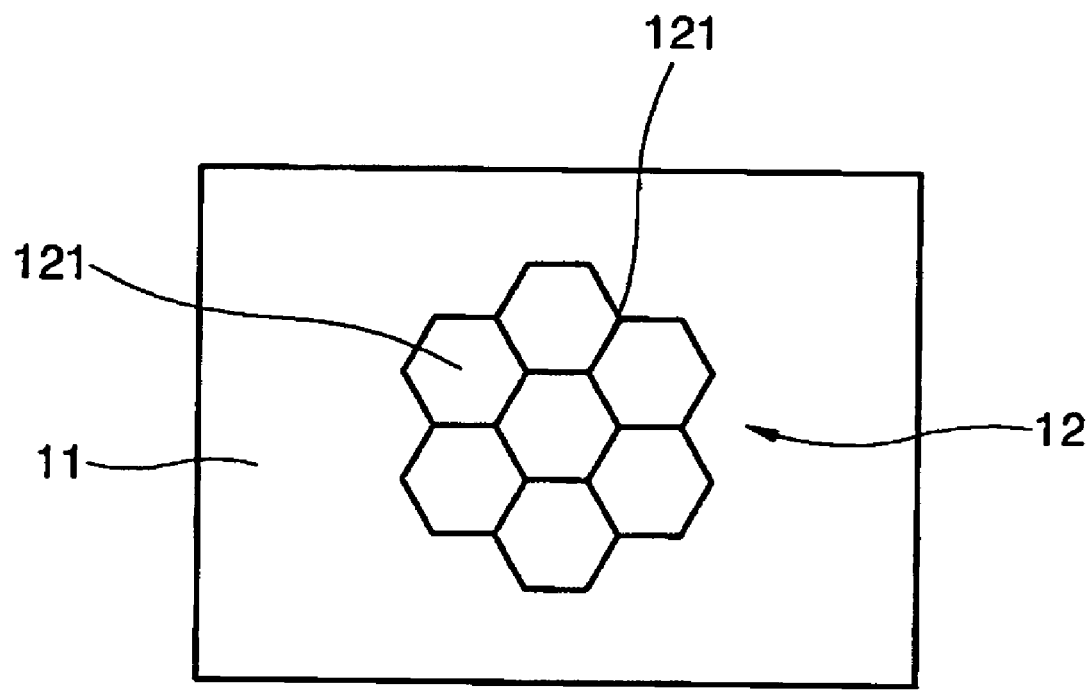

FIGS. 1A and 1B symbolically show structures of a crystal grain 12 as a seed grown into an island shape on a substrate 11. The crystal grain 12 has a plurality of crystal faces 121, and the nano-wire is grown from the crystal faces. FIG. 1A is a perspective diagram illustrating a steric structure of the crystal grain 12, and FIG. 1B is a top plan view thereof.

Figure 1C:
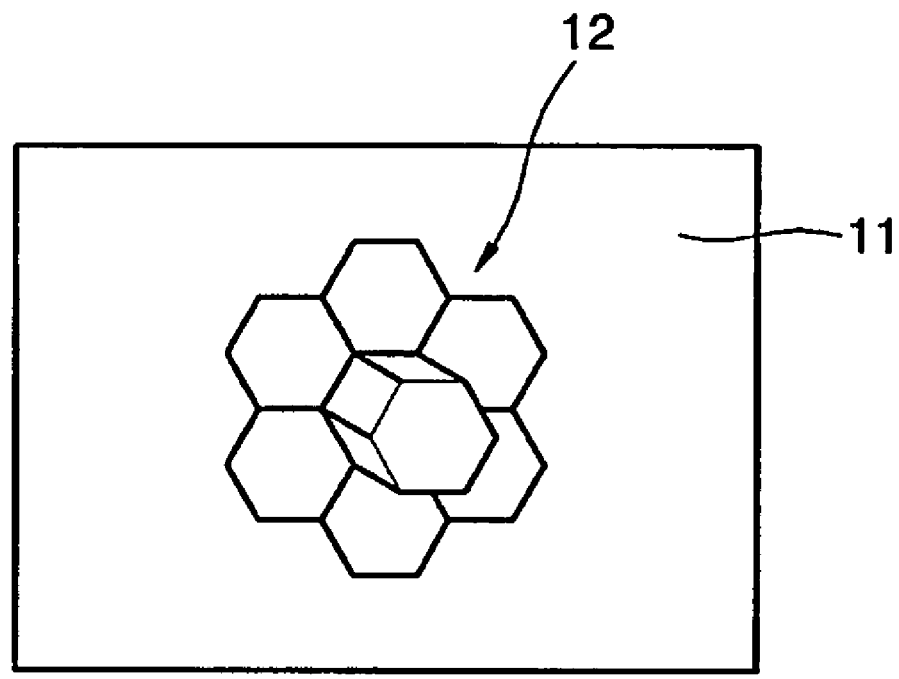
FIG. 1C is a perspective view illustrating a nano-wire grown from one crystal face of the crystal grain illustrated to FIGS. 1A and 1B.
Figure 1D:
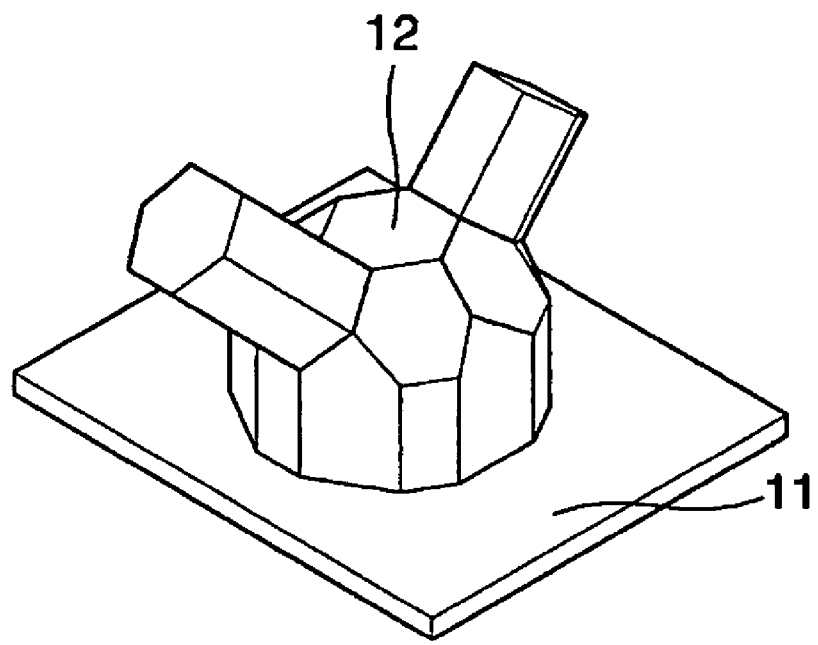
FIG. 1D is a perspective view illustrating a nano-wire grown from two crystal faces of the crystal grain illustrated to FIGS. 1A and 1B.

FIG. 1C is a perspective view illustrating a nano-wire grown from one crystal face of the crystal grain. FIG. 1D is a perspective view illustrating a state of a nano-wire grown from two crystal faces.

FIG. 1C shows a one-dimensional nano-wire generated from a portion of the same kind of polycrystalline or where a lattice constant of the crystal grain 12 is similar to a lattice constant of a material (i.e., a crystal growing material), which is different from the crystal grain material, to be grown from the crystal grain. FIG. 1D shows a nano-wire grown from a crystal grain of an Island shape having an edge shape on the substrate as a case where the same kind of material is grown.

Figure 2A:
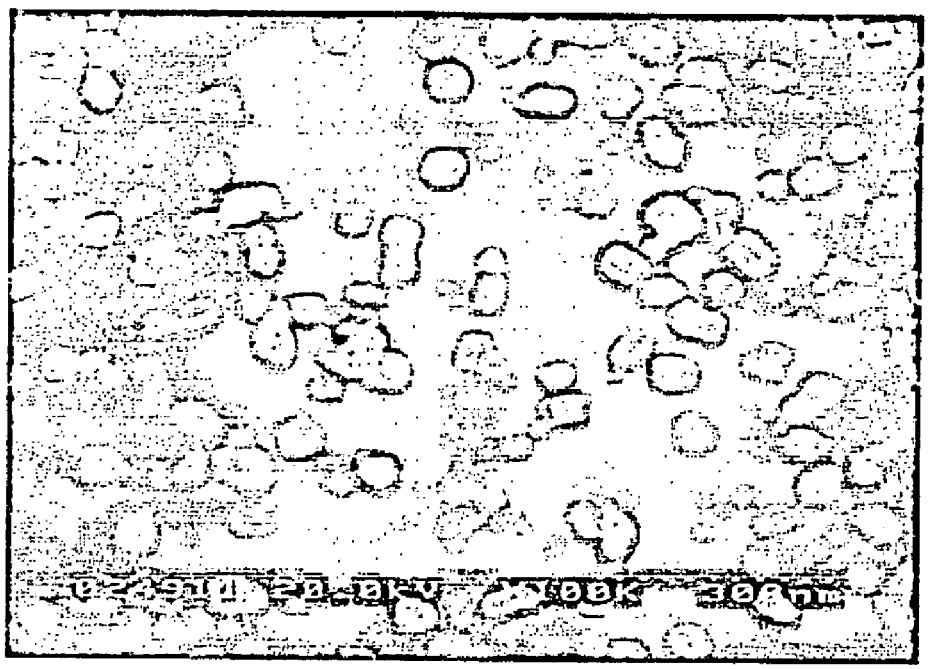
FIG. 2A shows a SEM (Scanning Electron Microscope) image illustrating a ZnO dot as the crystal grain grown from the substrate according to the present invention.
Figure 2B:
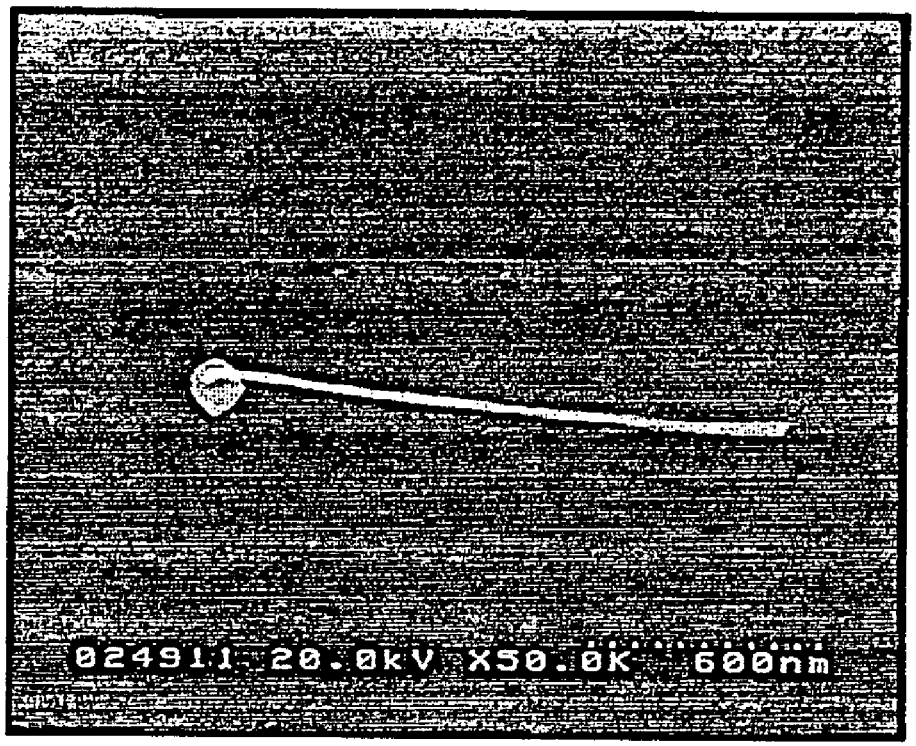
FIG. 2B shows a SEM image illustrating a sample of the nano-wire grown from the ZnO crystal grain illustrated to FIG. 2A according to the present invention.

FIG. 2A shows a scanning electron microscopy (SEM) image illustrating a ZnO dot as the crystal grain grown from a Si substrate according to the present invention. FIG. 2B shows a SEM image illustrating a sample of the nano-wire grown from the ZnO crystal grain grown from the substrate.

The ZnO crystal grain shown in FIG. 2A has a diameter of about 30 nm and is grown under a temperature of 450 to 550° C. The ZnO of a single crystal shown in FIG. 2B is grown one-dimensionally for about 20 minutes. A ZnO Island used as a seed for an experiment is synthesized using the chemical vapor deposition method, and the ZnO Island is generated from the Si substrate by supplying Zn and air (oxygen) for a short time.

The following table shows a condition for growing a ZnO nano-wire from the ZnO crystal grain, that is, a ZnO seed and a crystal face thereof.

|  | Temperature | Time | Air flow rate | Pressure |
| --- | --- | --- | --- | --- |
| ZnO seed | 400° C. | 5 min. | 50 sccm | $5 \times 10^{-2}$ torr |
| ZnO nano-wire | 500° C. | 1 hr. | 50 sccm | $5 \times 10^{-2}$ torr |

Figure 3A:
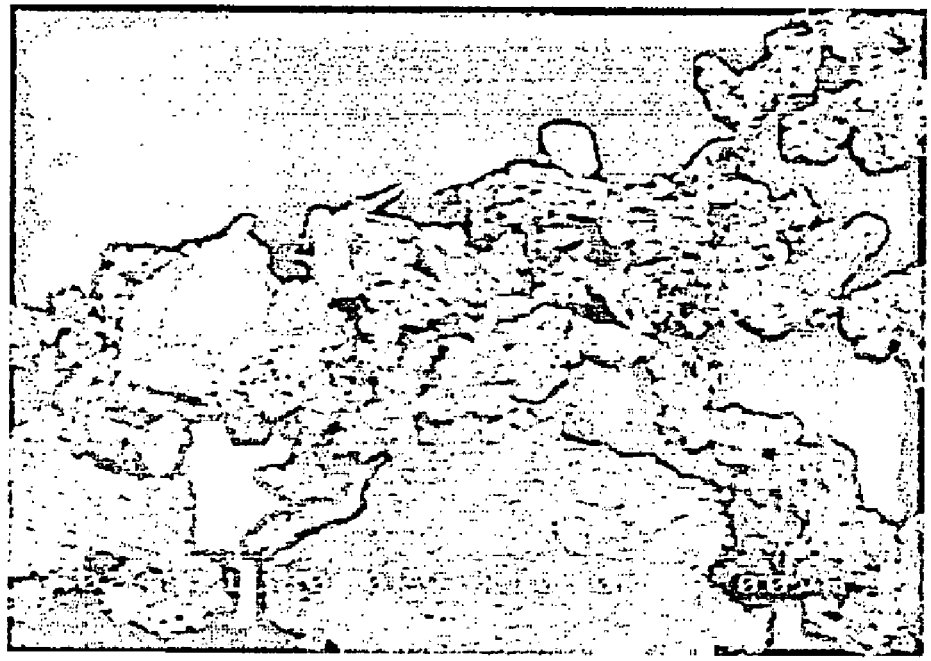
FIG. 3A shows a SEM image illustrating GaN powders as crystal grains for growing the nano-wire according to the present invention.
Figure 3B:
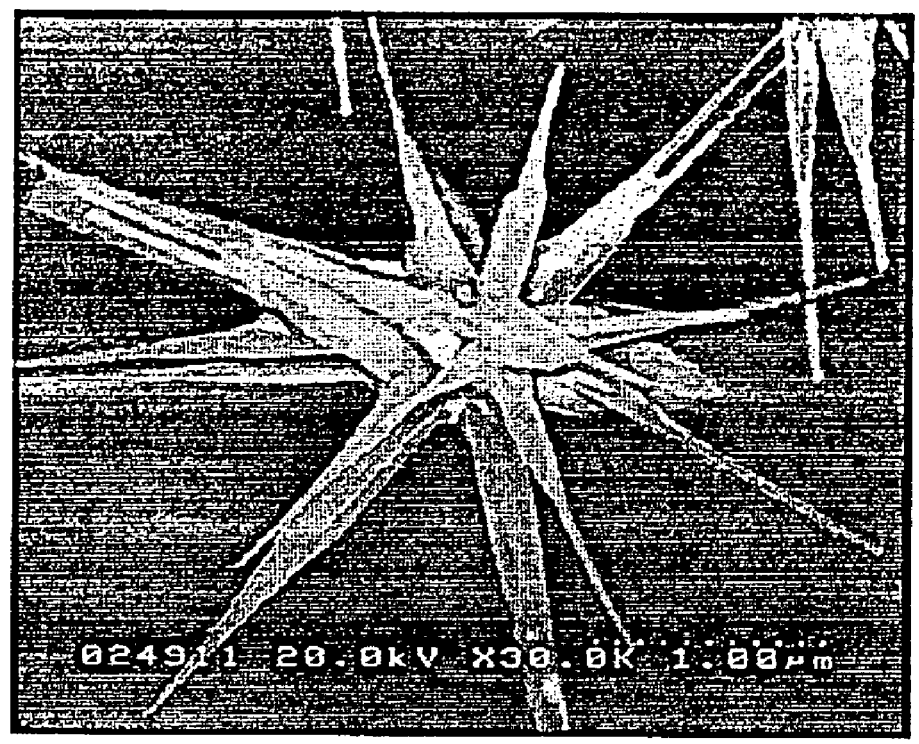
FIG. 3B shows a SEM image illustrating a sample of the nano-wire grown from the GaN crystal grains illustrated to FIG. 3A according to the present invention.

FIG. 3A shows a SEM image illustrating GaN powders dispersed on the substrate as crystal grains for growing a nano-wire according to the present invention. FIG. 3B shows a SEM image illustrating a sample of the nano-wire grown from a GaN crystal grain.

As shown in FIG. 3A, in order to use GaN powders as seeds, GaN powders are dried after dispersing together with an organic solvent such as an acetone on the Si substrate. FIG. 3A shows the grown result of the ZnO grown on a surface of a GaN crystal grain for about 20 minutes. FIG. 3B shows a ZnO nano-wire grown into three-dimensions on the surface of the GaN crystal grain. A growth condition of a ZnO nano-wire on the GaN crystal grain preferably is the same as a growth condition of the ZnO nano-wire on the ZnO Island as described above.

Figure 4:
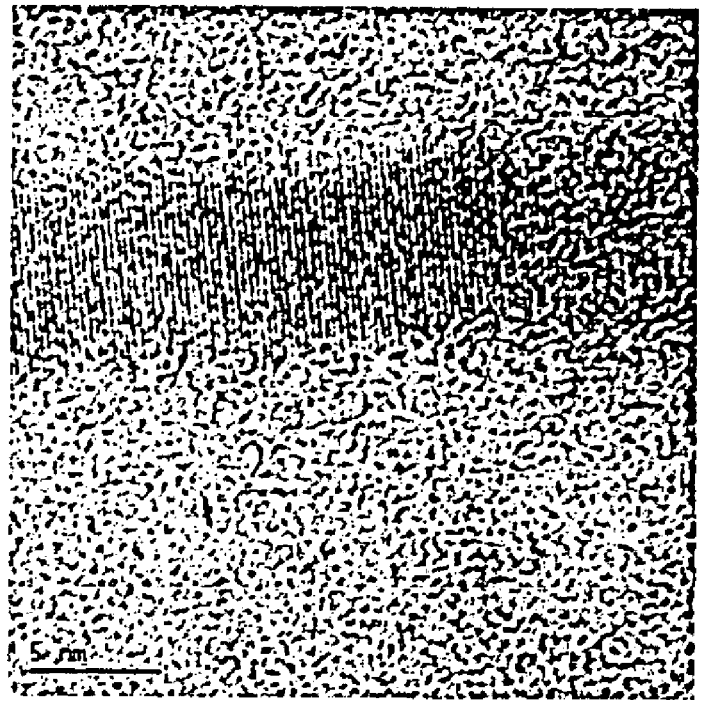
FIGS. 4 and 5 show TEM images illustrating crystals of a ZnO nano-wire synthesized according to the present invention.
Figure 5:
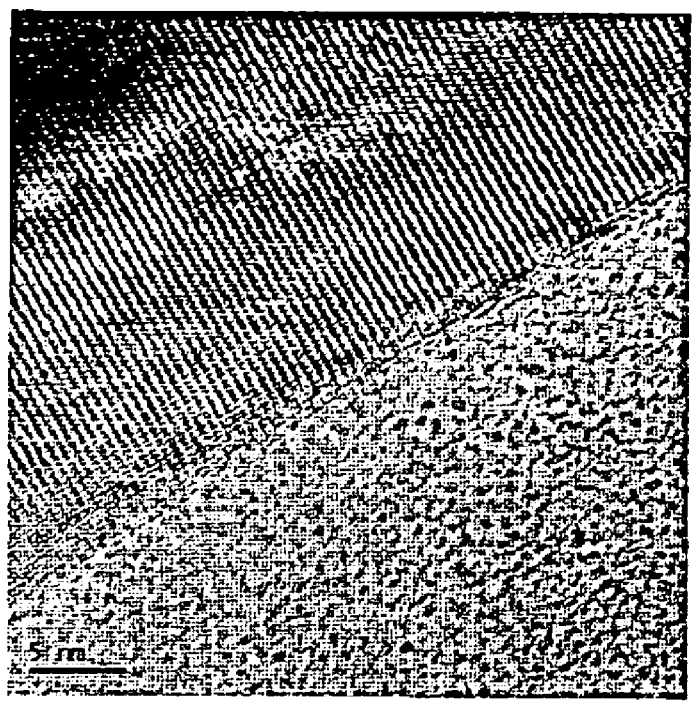

FIGS. 4 and 5 shows transmission electron microscope (TEM) images illustrating a crystal of the ZnO nano-wire synthesized according to the present invention. FIG. 4 shows a crystal shape of the ZnO nano-wire having a very thin thickness. FIG. 5 shows an interlayer structure of the ZnO nano-wire having a good crystallinity at an interface of different kind of growing materials.

Figure 6:
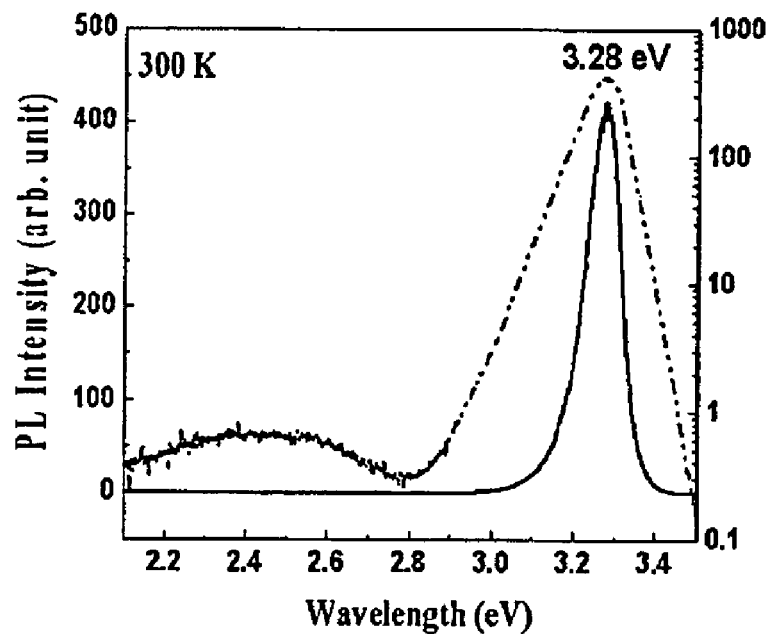
FIGS. 6 and 7 are graphs illustrating an optical characteristic and a field emission characteristic of the ZnO nano-wire synthesized according to the present invention.
Figure 7:
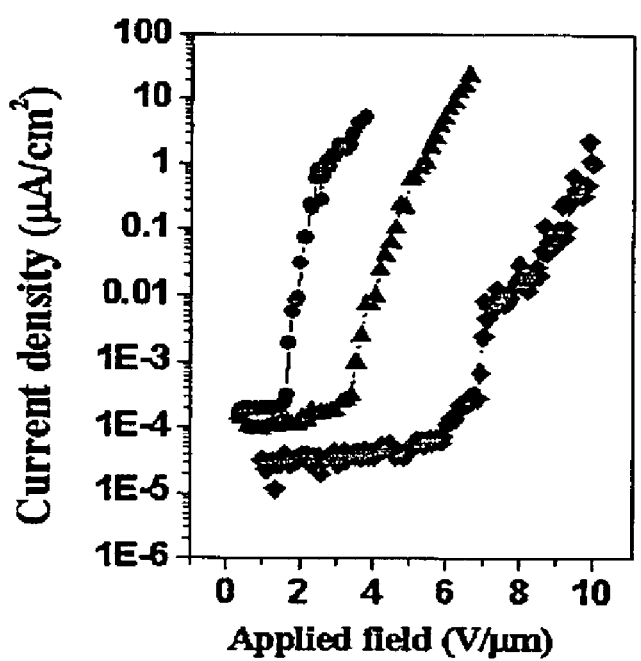

FIGS. 6 and 7 are graphs illustrating an optical characteristic and a field emission characteristic of the ZnO nano-wire synthesized according to the method of the present invention.

As shown in FIG. 6, the ZnO Nano-wire manufactured by a method of the present invention shows a high photoelectric effect at a wave length of about 3.28 eV, so that the wire can be used as an emitting light element.

FIG. 7 is a graph illustrating electric field-current density characteristics for 3 samples, and confirms that the ZnO nano-wire is available as an electron emission element.

The data of the 3 samples are as follows:

▲: Nano wire of 1 μm length and 20-30 nm diameter which is vertically synthesized under 500° C. on a Si substrate coated with Au;

●: Nano wire of 1 μm length and 2-30 nm diameter which is vertically synthesized under 500° C. on a bare Si substrate; and ◆: Nano wire of 1 μm length and 5-50 nm diameter which is vertically synthesized under 500° C. on a bare Si substrate.

As described above, according to the present invention, it is possible to generate a nano-wire available in a various use of electric elements, photo elements, sensors, etc. and to synthesize a nano-wire by using the same or different kind of crystal grain having a similar crystal shape for generating the nano-wire.

That is, the present invention uses as a seed a crystal grain having a lattice constant similar to a lattice constant of a nano-wire material (or a crystal growing material) to generate. Preferably, the lattice constant difference between the seed and the crystal growing material is 5% or less According to the present invention, it is possible to overcome restriction of structural adjustment of a method of synthesizing with a conventional metal particle catalyst and to embody a feature of a heterojunction structure according to a feature of a crystal grain used as a seed, by growing a nano-wire of one-dimensional structure and three-dimensional structure using a crystal particle.

By using a different kind of material as a seed, it is possible to generate a nano-wire or a nano-structure having a feature of a heterojunction. For example, it is possible to embody a p-n junction element by using a semiconductor material of p-type (Mg doped GaN) and a nano-structure of n-type (ZnO) as a seed material.

As described above, according to the present invention, it is possible to give the positional selectivity with a simple process using a principle of crystal growth and to generate a nano-structure such as a nano-wire, etc. having good crystallinity. Further, it is possible to generate a different-kind junction structure having various shapes by adjusting a feature of a crystal grain used as a seed.

Therefore, the present invention can be applied to various fields of electric elements, photoelectric elements, gas sensors, etc. and specifically, to filed effect transistors (FETs), light emitting diodes (LEDs), sensors, electron emission elements, etc.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A method of manufacturing a nano-wire, comprising:
preparing a crystal grain having a plurality of crystal faces by dispersing a crushed crystal grain on a substrate, the crystal grain acting as a seed; and
depositing a crystal growing material on the crystal grain using a chemical vapor deposition or a vacuum heat deposition to grow the nano-wire from at least one of the crystal faces, a lattice constant difference between the crystal grain and the crystal growing material being within a predetermined range.

2. The method according to claim 1, wherein the crystal grain and the crystal growing material are the same material.

3. The method according to claim 1, wherein the crystal grain and the crystal growing material are different materials.

4. The method according to claim 1, wherein the crystal growing material includes an element of Group II, VI, III, or IV of the Periodic Table.

5. The method according to claim 1, wherein the crystal grain and the crystal growing material are different materials, and the lattice constant difference between the seed and the crystal growing material is 5% or less.

6. A method of manufacturing a nanostructure, comprising:
preparing a crystal grain having a plurality of crystal faces as a seed on a substrate by dispersing a crushed crystal grain on the substrate ; and
depositing a crystal growing material on the crystal grain to grow the crystal growing material from at least one of the crystal faces, a lattice constant difference between the crystal grain and the crystal growing material being not more than 5%.

7. The method according to claim 6, wherein the crystal grain and the crystal growing material are the same material.

8. The method according to claim 6, wherein the crystal grain and the crystal growing material are different materials.

9. The method according to claim 6, wherein the crystal growing material includes an element of Group II, VI, III, or IV of the Periodic Table.

10. The method according to claim 6, wherein the step of depositing is performed using a chemical vapor deposition method or a vacuum heat deposition method.

11. The method according to claim 6, wherein the crystal grain is prepared by spraying the crushed crystal grain at a dispersed state in an organic solvent and removing the organic solvent.

12. The method according to claim 6, wherein the substrate is silicon substrate.

13. The method according to claim 6, wherein the step of depositing the crystal growing material is performed at approximately 450 to 550° C. for approximately 1 hour.

14. The method according to claim 6, wherein the crystal grain comprises ZnO.

15. The method according to claim 6, wherein the crystal grain comprises GaN.

16. The method according to claim 6, wherein the crystal grain comprises GaN, and the crystal growing material comprises ZnO.

* * * * *